US009066591B2

(12) United States Patent
Chen et al.

(10) Patent No.: US 9,066,591 B2

(45) Date of Patent: Jun. 30, 2015

(54) FIXING DEVICE FOR A SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 53 days.

(21) Appl. No.: 13/914,847

(22) Filed: Jun. 11, 2013

(65) Prior Publication Data

US 2014/0363108 A1 Dec. 11, 2014

(51) Int. Cl.

*A47B 88/04* (2006.01)

*H05K 7/14* (2006.01)

(52) U.S. Cl.

CPC ............ *A47B 88/044* (2013.01); *H05K 7/1489* (2013.01)

(58) Field of Classification Search

CPC .. A47B 88/04; A47B 88/044; A47B 88/0418; A47B 2088/0418; H05K 7/1489

USPC .......... 312/334.1, 334.4, 334.5, 330.1, 334.7, 312/350, 351; 211/26; 248/220.21, 220.22, 248/220.41, 220.31, 250

See application file for complete search history.

(56) References Cited

U.S. PATENT DOCUMENTS

| | | | | |
|---|---|---|---|---|
| 6,749,275 | B2 * | 6/2004 | Cutler et al. | 312/334.4 |
| 6,929,339 | B1 | 8/2005 | Greenwald et al. | |
| 6,935,711 | B1 * | 8/2005 | Naue et al. | 312/334.4 |
| 7,878,468 | B2 * | 2/2011 | Chen et al. | 248/220.41 |
| 8,727,138 | B2 * | 5/2014 | Dittus et al. | 211/26 |
| 2004/0089779 | A1 * | 5/2004 | Greenwald et al. | 248/241 |
| 2005/0189855 | A1 * | 9/2005 | Naue et al. | 312/334.4 |
| 2010/0200523 | A1 * | 8/2010 | Henderson | 211/26 |
| 2012/0292274 | A1 | 11/2012 | Lin et al. | |
| 2013/0056432 | A1 | 3/2013 | Lin et al. | |

* cited by examiner

*Primary Examiner* — James O Hansen

(74) *Attorney, Agent, or Firm* — Rosenberg, Klein & Lee

(57) ABSTRACT

A fixing device of a slide assembly has a bracket. The fixing device includes an insertion member, an engaging member and a resilient member. The insertion member is connected to the bracket and has a slot. The engaging member is pivotally connected relative to the bracket and has an operation portion and an arm which extends through the slot of the insertion member. The arm has a first protrusion. The resilient member provides a force to the engaging member to extend the first protrusion beyond the slot of the insertion member. By moving the operation portion, the first protrusion is controlled to be retracted toward the slot of the insertion member.

8 Claims, 19 Drawing Sheets

FIXING DEVICE FOR A SLIDE ASSEMBLY

FIELD OF THE INVENTION

The present invention relates to a slide assembly, and more particularly, to a fixing device for a slide assembly so as to securely connect the slide assembly to a rack.

BACKGROUND OF THE INVENTION

U.S. Pat. Nos. 6,929,339 and 6,957,878 to Greenwald et al. and US Patent Publication Nos. 2012/0292274 and 2013/0056432 to Lin et al. respectively disclose a fixing device for a slide assembly and these fixing devices are referenced when preparing the specification of the present invention.

Each of the conventional fixing devices disclosed in the above-mentioned cases generally comprises an arm having a hook, a spring providing a force to the arm, and an installation member with a slot. The arm is inserted into the slot of the installation member, and the hook of the arm protrudes from the slot by the force provided by the spring. The arm directly extends through the installation member so that when the installation member is to be connected to the positioning hole of the column of a rack, the hook exposed from the slot of the installation member affects the installation of the installation member to the rack. Besides, the slot in the installation member reduces the structural strength of the installation member and hence affects the stability of for installing the installation member to the rack.

The present invention intends to provide a fixing device for a slide assembly, and the fixing device handily and securely connects the slide assembly to a rack.

SUMMARY OF THE INVENTION

The present invention relates to a slide assembly to be connected to a rack by a fixing device, and the slide assembly comprises a support member and a bracket is connected to the support member. The bracket has a side wall and an end wall, wherein the side wall has a window. The end wall is substantially perpendicularly connected to the side wall. At least one installation member connected to the end wall of the bracket. An insertion member is connected to the end wall of the bracket and has a slot defined therein. An engaging member is pivotally connected relative to the bracket and has an operation portion and an arm. The operation portion is located corresponding to the window of the side wall of the bracket. The arm extends through the slot of the insertion member and has a first protrusion. A resilient member provides a force to the engaging member to extend the first protrusion beyond the slot of the insertion member.

Furthermore, the present invention provides a fixing device for being connected to a bracket and the fixing device comprises at least one installation member connected to the bracket. An insertion member is connected to the bracket and has a slot. An engaging member is pivotally connected to the bracket and has an arm which extends through the slot of the insertion member. The arm has a first protrusion. A resilient member provides a force to the engaging member to extend the first protrusion beyond the slot of the insertion member.

Preferably, the end wall has a through hole and the insertion member extends through the through hole.

Preferably, the insertion member has a body and a head connected with the body. The body of the insertion member has a recessed area and a first locking portion which is located in the recessed area and adjacent to the head.

Preferably, the end wall has two installation holes, a fixing member and two installation members which are connected to the fixing member. The fixing member is fixed to the bracket, and the installation members extend through the installation holes of the end wall of the bracket respectively.

Preferably, each installation member has a movable rectangular portion, a cylindrical portion and a spring. The spring applies a force to the rectangular portion so that the rectangular portion extends beyond the fixing member and located at a pre-set position.

Preferably, the resilient member is located between the fixing member and the engaging member. The resilient member has a first resilient section, a second resilient section and a connection section which is connected between the first and second resilient sections.

Preferably, the first and second resilient sections and the connection section of the resilient member define a resilient space. The first resilient section has two first side walls. The first side walls and the first resilient section define a first recess. The second resilient section has two second side walls. The second side walls and the second resilient section define a second recess. The fixing member has a first contact portion. The engaging member has a second contact portion. The first contact portion and the second contact portion contact the first and second recesses respectively.

Preferably, a slide is slidably connected to the bracket and the slide movably contacts the engaging member. When the slide slides relative to the bracket, the slide drives the engaging member to pivot relative to the bracket so that the first protrusion of the engaging member is retracted toward the slot.

Besides, the present invention provides a slide assembly for being installed to a rack. The rack has multiple columns and each column has multiple holes which comprises a first hole, a second hole and a third hole which is located between the first and second holes. A chassis is connected to the rack by two slide assemblies. The chassis has a locking device. Each slide assembly comprises a first rail and a second rail which is slidable relative to the first rail. A bracket is connected to the first rail. The bracket has a side wall and an end wall. The side wall has a window. The end wall is connected to the side wall perpendicularly. The end wall has two installation holes and a through hole. A fixing member is fixed to the bracket. A third rail is slidably connected between the first and second rails. An insertion member is connected to the end wall of the bracket and partially extends through the through hole of the end wall of the bracket. The insertion member has a slot and a locking portion which is located corresponding to the locking device of the chassis. An engaging member is pivotally connected to one of the bracket and the fixing member. The engaging member has an operation portion and an arm. The operation portion is located corresponding to the window of the side wall of the bracket. The arm extends through the slot of the insertion member and has a first protrusion. A resilient member provides a force to the engaging member to extend the first protrusion beyond the slot of the insertion member. Two installation members are connected to the fixing member and extend through the installation holes of the end wall of the bracket respectively. The two installation members are connected to the first and second holes of the column of the rack respectively. The insertion member is inserted into the third hole of the column of the rack. The arm of the engaging member extends through the slot of the insertion member. The first protrusion of the engaging member extends beyond the slot of the insertion member and is connected to the column of the rack by the force of the resilient member applied to the engaging member. When the slide assembly is installed to the rack, the first locking portion of the insertion member is engaged with the locking device of the chassis.

Preferably, a slide is slidably connected to the bracket and the slide movably contacts the engaging member. When the slide slides relative to the bracket, the slide drives the engaging member to pivot relative to the bracket so that the first protrusion of the engaging member is retracted toward the slot.

Preferably, the direction that the slide moves relative to the bracket is identical to the direction that the slide assembly is removed from the rack.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
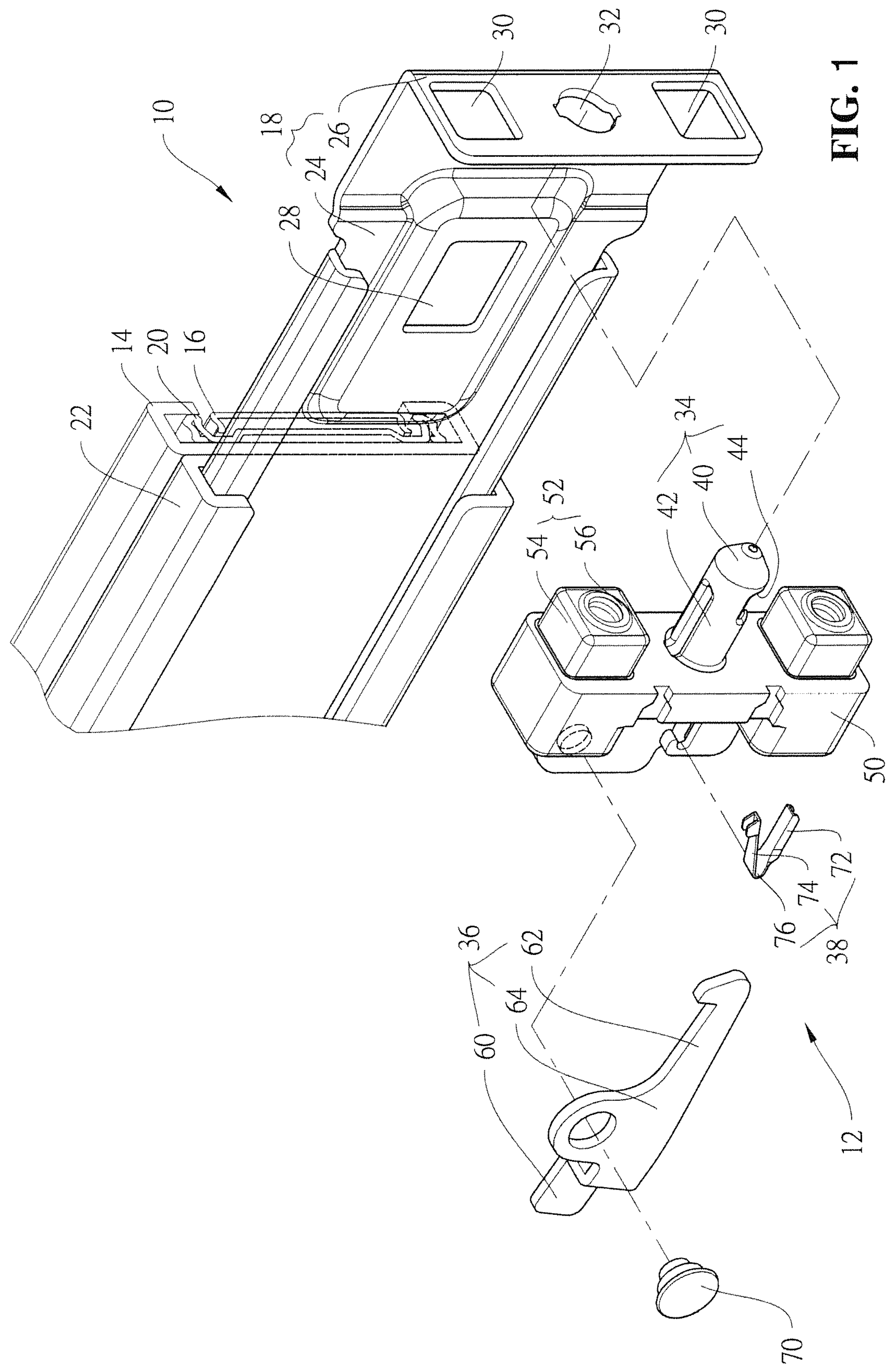
FIG. 1 is an exploded view to show the bracket and the fixing device of the slide assembly.
Figure 1A:
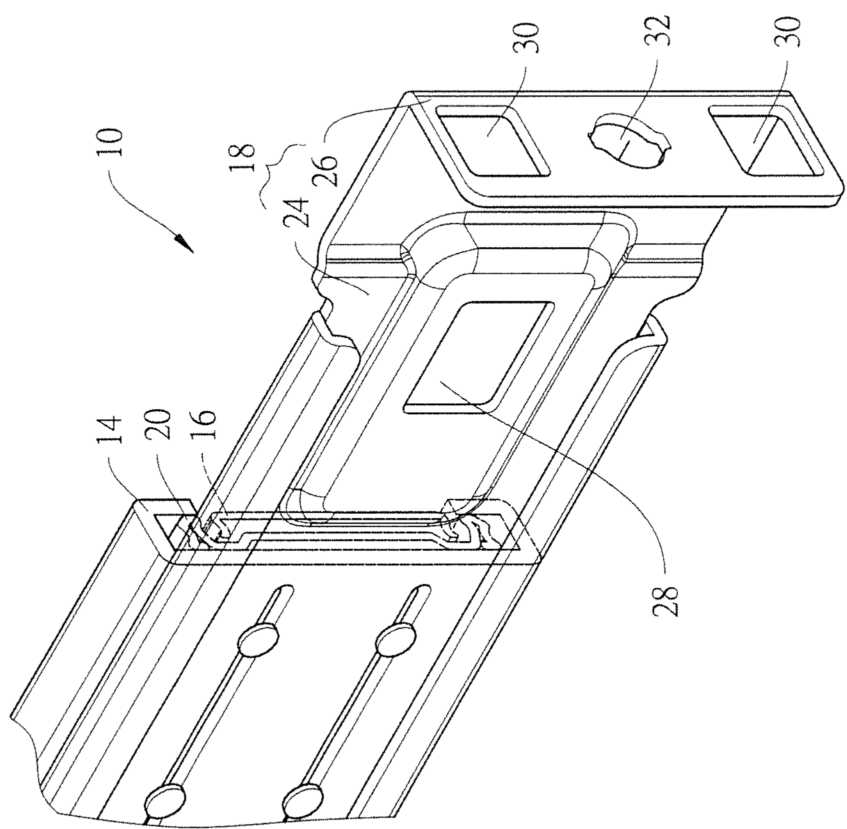
FIG. 1A shows that the bracket is connected with the first rail.

FIG. 1 shows the slide assembly 10 and a fixing device 12 of an embodiment of the present invention. The slide assembly 10 comprises a first rail 14, a second rail 16 slidable relative to the first rail 14, and a bracket 18. Preferably, a third rail 20 is slidably connected between the first and second rails 14, 16, so that the second rail 16 is extendable to a further position relative to the first rail 14 by the third rail 20. In one embodiment, a support member 22 is connected to the first rail 14, and the bracket 18 is connected to the support member 22. The support member 22 is securely fixed to the first rail 14 so that the support member 22 is deemed as a part of the first rail 14. As shown in FIG. 1A, in another embodiment, the bracket 18 is directly connected to the first rail 14. More specifically, the bracket 18 has a side wall 24 and an end wall 26, and the end wall 26 is substantially perpendicularly connected to the side wall 24. Preferably, the end wall 26 is bent from the front end of the side wall 24. The side wall 24 has a window 28. The end wall 26 has two installation holes 30 and a through hole 32. Preferably, the through hole 32 is located between the two installation holes 30. The fixing device 12 has an insertion member 34, an engaging member 36 and a resilient member 38.

Figure 2:
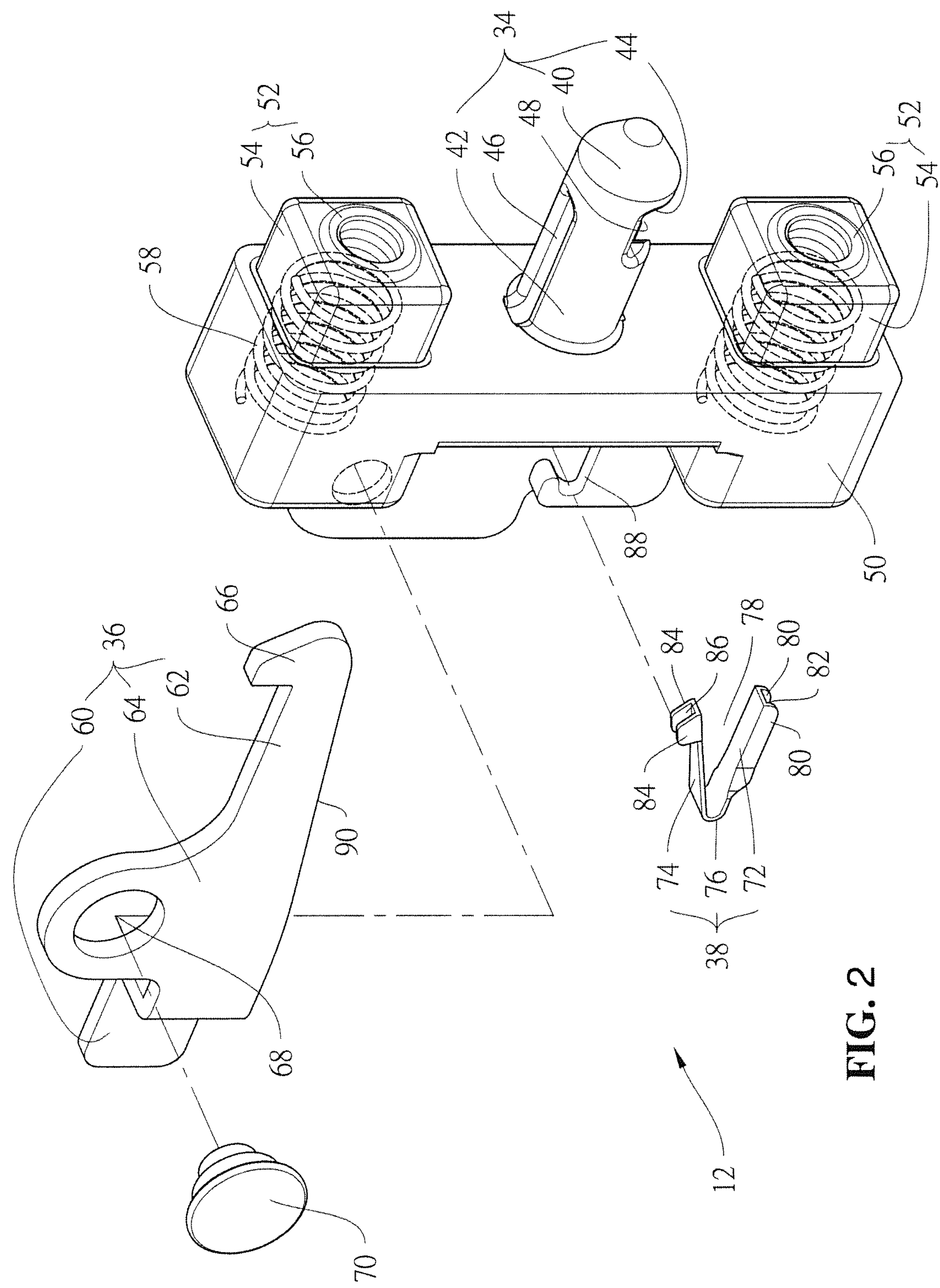
FIG. 2 is an exploded view to show the fixing device of the slide assembly.
Figure 3:
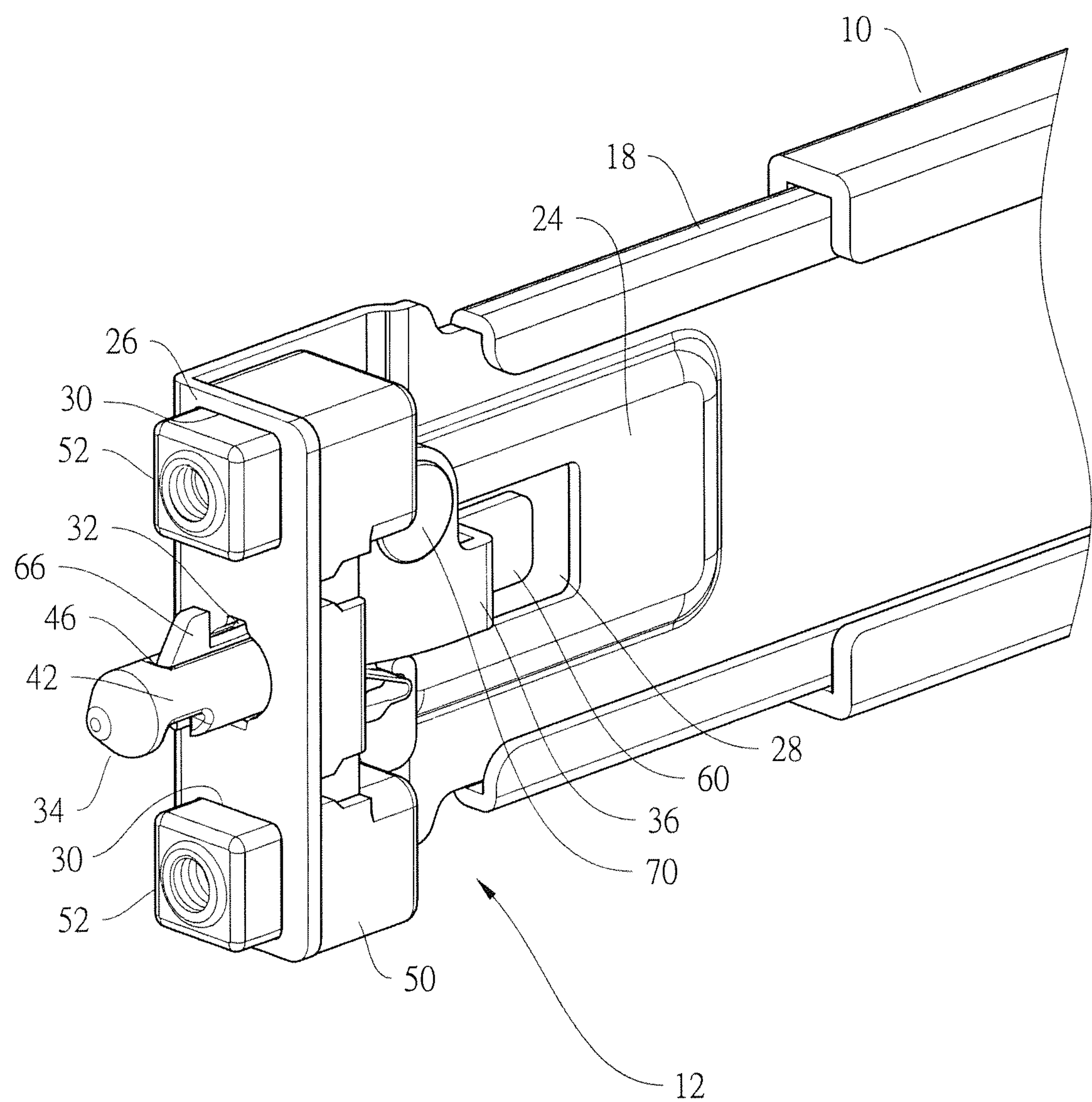
FIG. 3 shows that the fixing device is connected to the bracket of the slide assembly.

FIGS. 2 and 3 show an example of the arrangement of the fixing device 12. The insertion member 34 connected to the end wall 26 of the bracket 18 and has a head 40, a body 42 connected with the head 40, and a first locking portion 44. Preferably, the head 40 extends from one end of the body 42. The body 42 extends through the through hole 32 of the end wall 26 of the bracket 18. The body 42 has a slot 46 defined therein. The first locking portion 44 is connected to the body 42. Preferably, the body 42 of the insertion member 34 has a recessed area 48, and the first locking portion 44 is located in the recessed area 48 and adjacent to the head 40. In one embodiment, the fixing device 12 has a fixing member 50 and two installation members 52 which are connected to the fixing member 50. The fixing member 50 is fixed to the bracket 18. Preferably, the installation members 52 are arranged corresponding to the end wall 26 of the bracket 18. For example, the installation members 52 extend through the installation holes 30 of the end wall 26 of the bracket 18 respectively. In one preferable embodiment, each installation member 52 has a movable rectangular portion 54, a cylindrical portion 56 and a spring 58. The rectangular portion 54 is slidably connected to the cylindrical portion 56. The spring 58 applies a force to the rectangular portion 54 so that the rectangular portion 54 extends beyond the fixing member 50 and located at a pre-set position. The arrangement and functions of the installation member 52 is disclosed in U.S. Pat. No. 7,878,468 own by the applicant, and U.S. Pat. No. 7,878,468 is incorporated in the present invention.

Figure 3A:
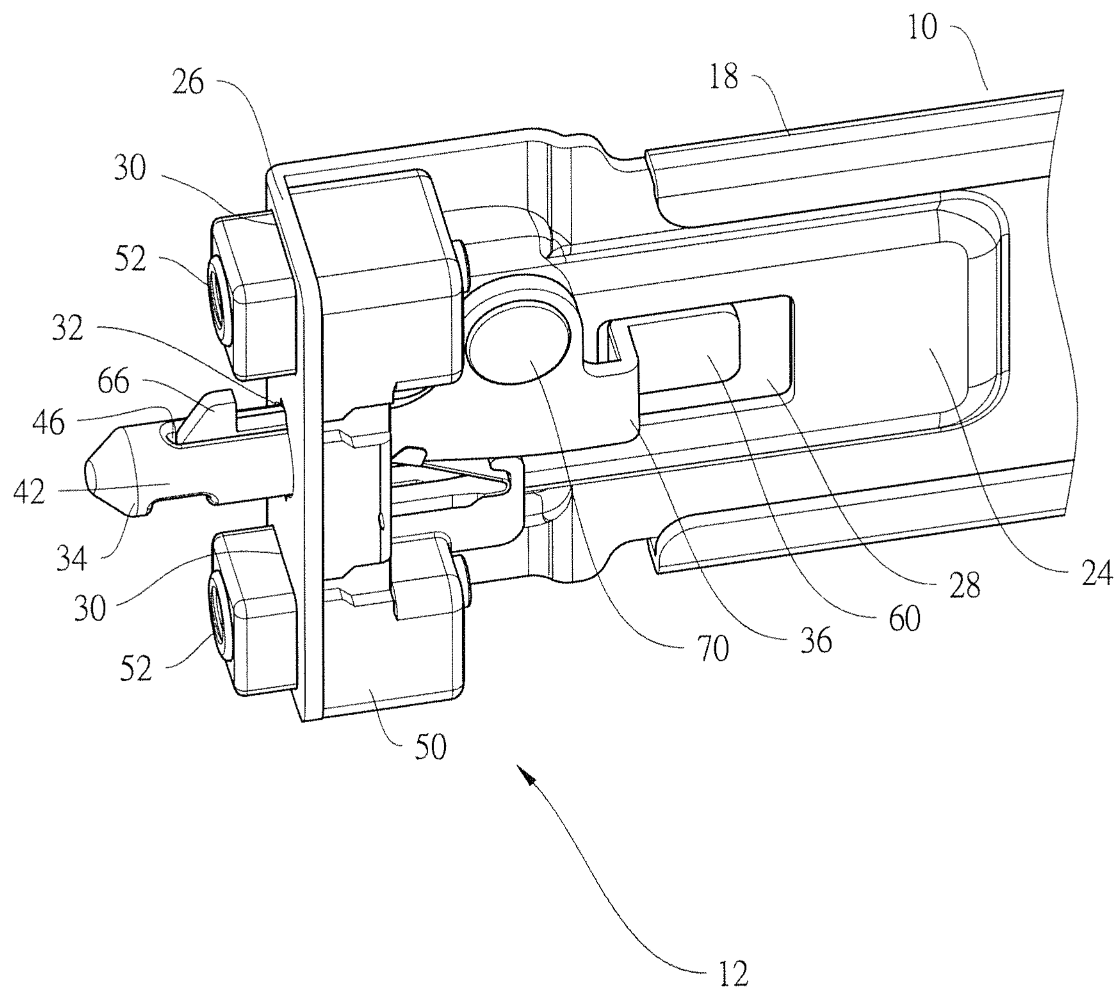
FIG. 3A shows that the engaging member is pivotally connected to the bracket.

The engaging member 36 has an operation portion 60, an arm 62 and a mediate portion 64 which is connected between the operation portion 60 and the arm 62. The operation portion 60 is located corresponding to the window 28 of the side wall 24 of the bracket 18. In one preferable embodiment, the operation portion 60 is bent from one end of the mediate portion 64. The arm 62 extends through the slot 46 of the insertion member 34 and has a first protrusion 66 which extends through the slot 46 and extends beyond the slot 46. The mediate portion 64 has a pivotal hole 68, and a pivot 70 extends through the pivotal hole 68 and is connected to the fixing member 50 to allow the engaging member 36 to be pivotal relative to the fixing member 50. It is noted that when the fixing member 50 is fixedly connected to the bracket 18, the fixing member 50 is deemed as a part of the bracket 18. As shown in FIG. 3A, in another embodiment, the engaging member 36 is directly and pivotally connected the bracket 18. Based on the above-mentioned embodiments of FIGS. 3 and 3A, the engaging member 36 can be connected to one of the fixing member 50 and the bracket 18. Therefore, the engaging member 36 may be deemed as to be pivotally connected relative to the bracket 18.

Figure 4:
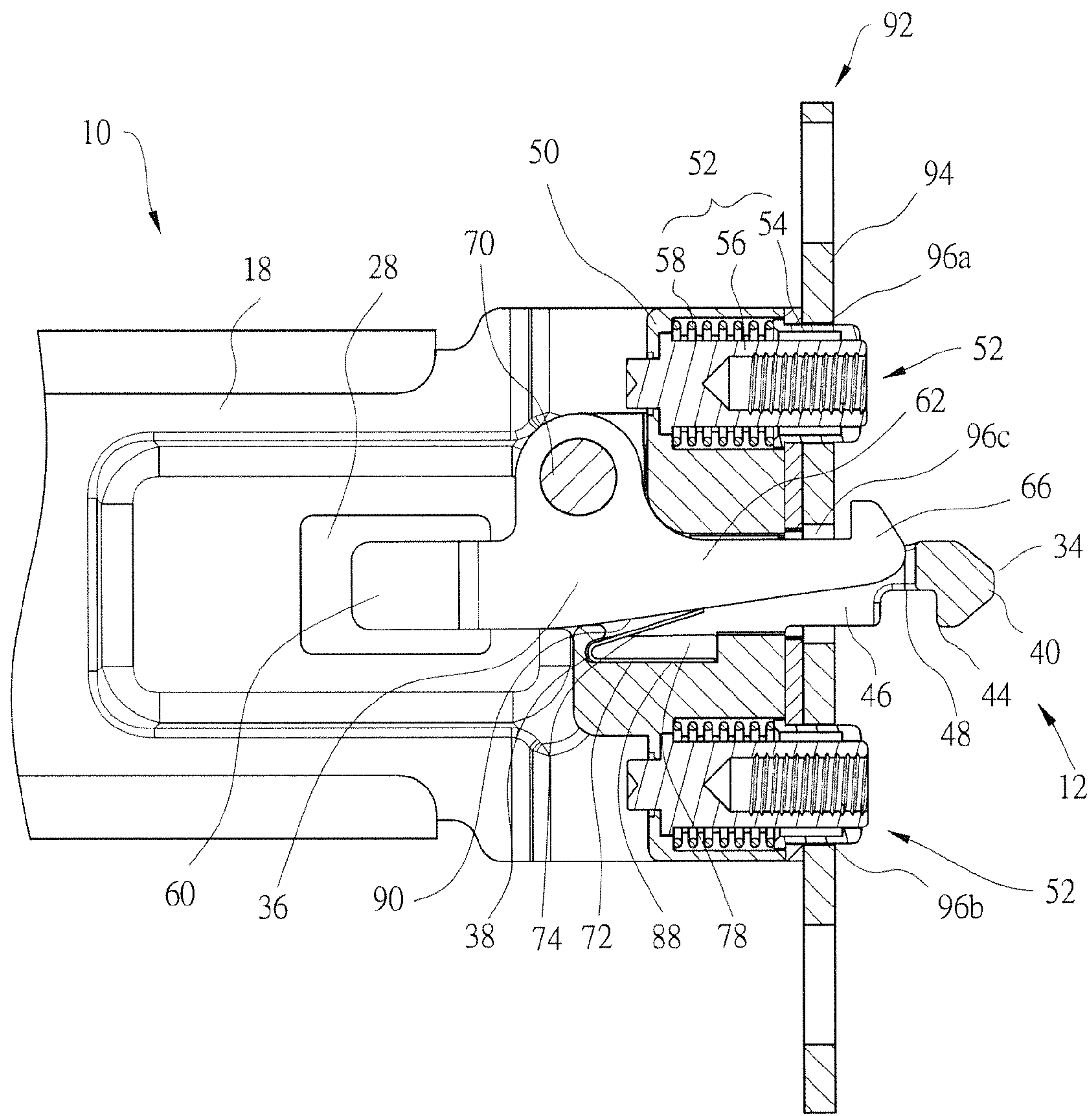
FIG. 4 is a cross sectional view to show that the bracket is connected to the column.

The resilient member 38 is located between the fixing member 50 and the engaging member 36. The resilient member 38 has a first resilient section 72, a second resilient section 74 and a connection section 76 which is connected between the first and second resilient sections 72, 74. The first and second resilient sections 72, 74 and the connection section 76 of the resilient member 38 define a resilient space 78 which provides the first and second resilient sections 72, 74 to be compressed and rebound. The first resilient section 72 has two first side walls 80. The first side walls 80 and the first resilient section 72 define a first recess 82. The second resilient section 74 has two second side walls 84. The second side walls 84 and the second resilient section 74 define a second recess 86. The fixing member 50 has a first contact portion 88, and the engaging member 36 has a second contact portion 90. By the first contact portion 88 and the second contact portion 90 contact the first and second recesses 82, 86 respectively, as shown in FIG. 4, the resilient member 38 provides a force to the engaging member 36 to extend the first protrusion 66 beyond the slot 46 of the insertion member 34. In one preferable embodiment, the resilient member 38 is a V-shaped resilient member.

Figure 5:
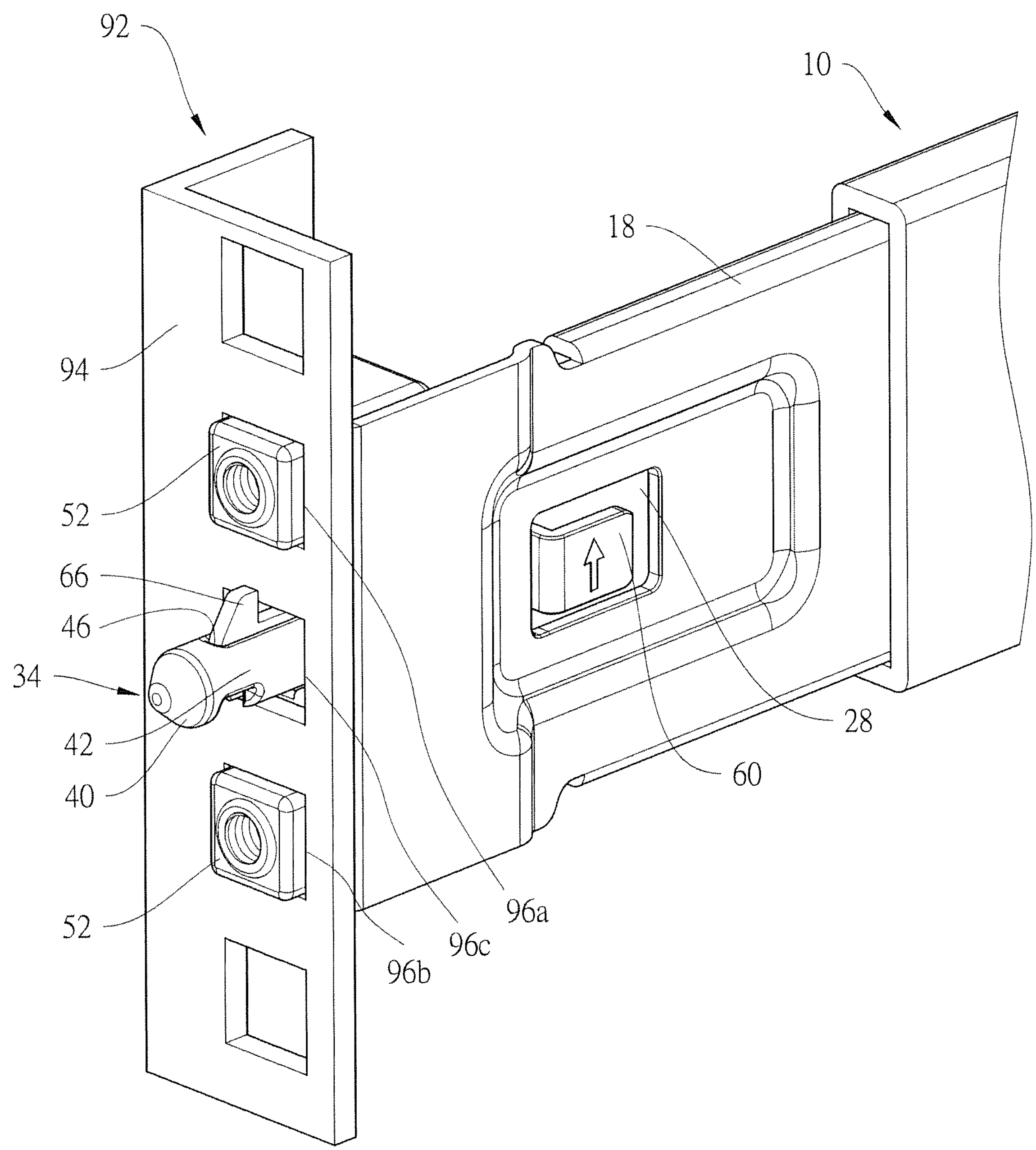
FIG. 5 is a perspective view to show the bracket connected to the column.

FIGS. 4 and 5 show that the slide assembly 10 is installed to a rack 92. The rack 92 at least has a column 94. The column 94 has multiple holes such as a first hole 96*a*, a second hole 96*b* and a third hole 96*c* which is located between the first and second holes 96*a*, 96*b*. More specifically, the two installation members 52 are installed through the first and second holes 96*a*, 96*b* of the column 94 of the rack 92 respectively. The insertion member 34 is inserted into the third hole 96*c* of the column 94 of the rack 92. The arm 62 of the engaging member 36 extends through the slot 46 of the insertion member 34. The first protrusion 66 of the engaging member 36 extends beyond the slot 46 of the insertion member 34 and is engaged with the column 94 of the rack 92 by the force of the resilient member 38 applied to the engaging member 36. Under this arrangement, the slide assembly 10 is secured to the column 94 of the rack 92 and does not separated from the column 94 by the installation members 52 installed to the column 94 and by the first protrusion 66 of the engaging member 36 of the fixing device 12 arranged corresponding to the column 94.

In one preferable embodiment, the distance that the insertion member 34 extends beyond the fixing member 50 is longer than the distance that the installation member 52 extends beyond the fixing member 50.

Figure 6:
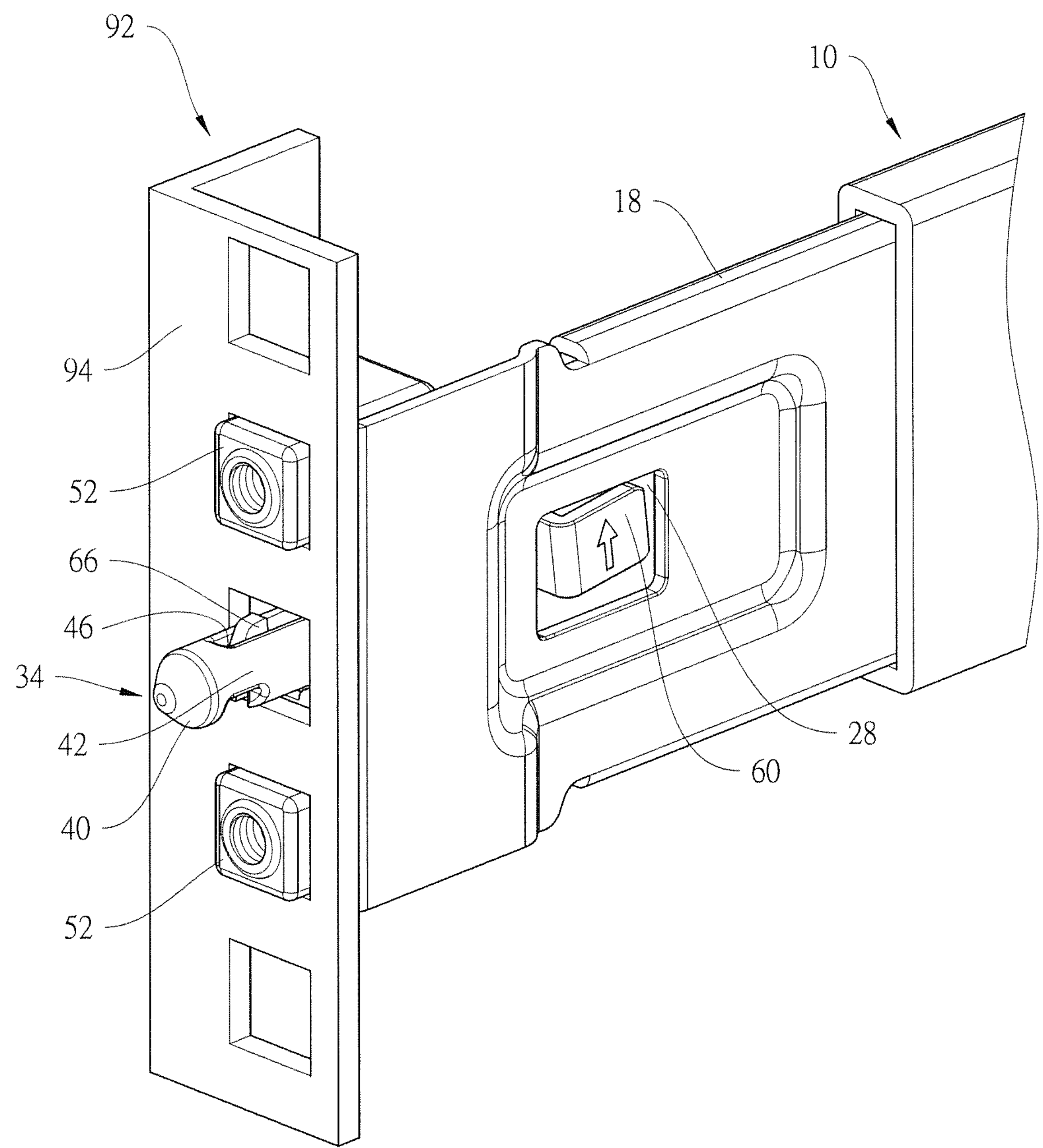
FIG. 6 is a perspective view to show the operation to separate the bracket from the column.
Figure 7:
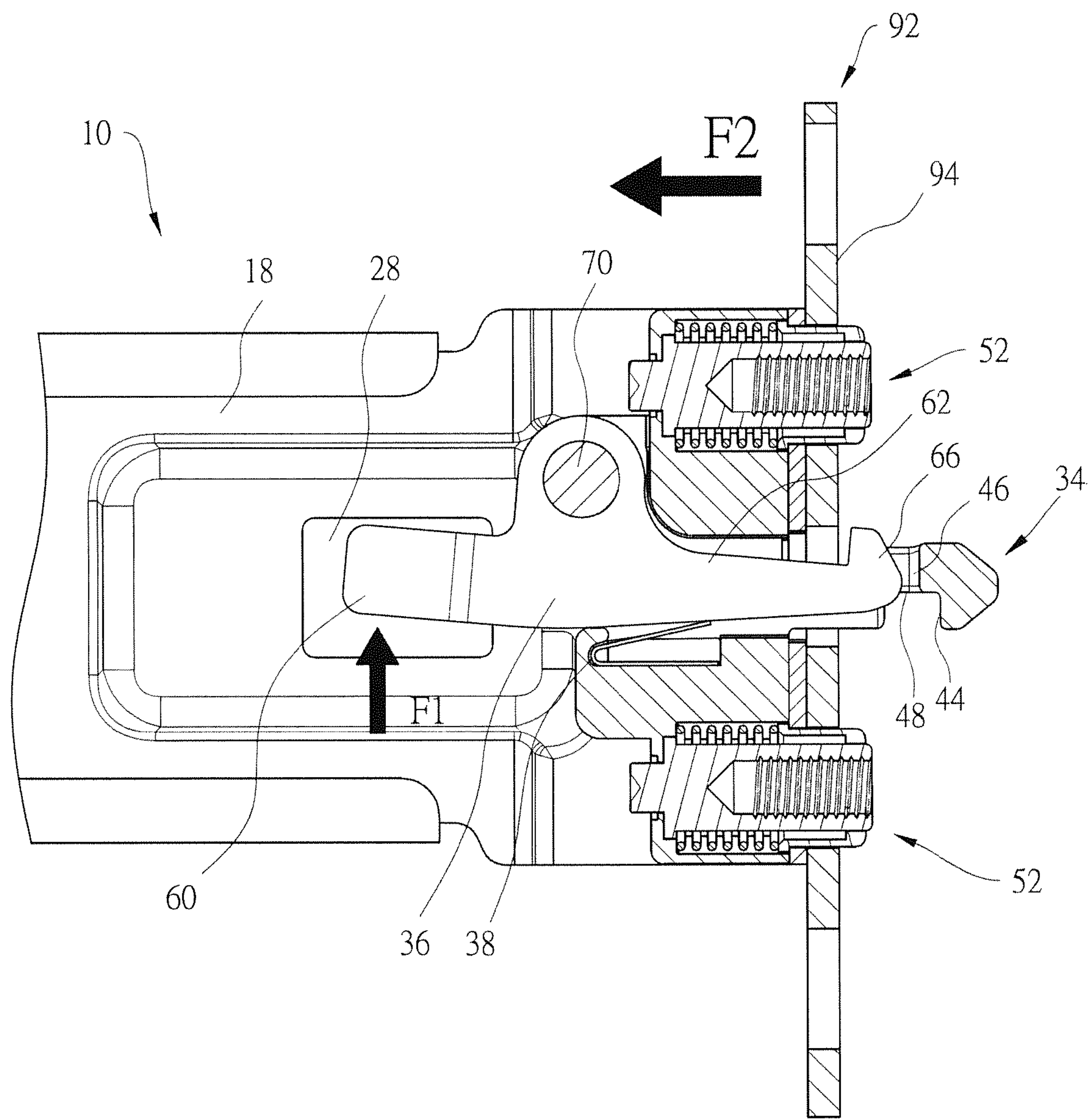
FIG. 7 is a cross sectional view to show that the bracket is to be separated from the column.

FIGS. 6 and 7 show the operation to disassemble the slide assembly 10 from the rack 92, wherein the user applies a force F1 from the window 28 of the bracket 18 to the operation portion 60 of the engaging member 36 to let the engaging member 36 overcome the spring force of the resilient member 38 until the first protrusion 66 of the engaging member 36 is retracted toward the slot 46 and does not interfere the column 94 of the rack 92. In this status, the first protrusion 66 of the engaging member 36 is disengaged from the column 94, so that the slide assembly 10 is able to be disassembled from the column 94 of the rack 92 from the direction indicated by F2 in FIG. 7.

Figure 8:
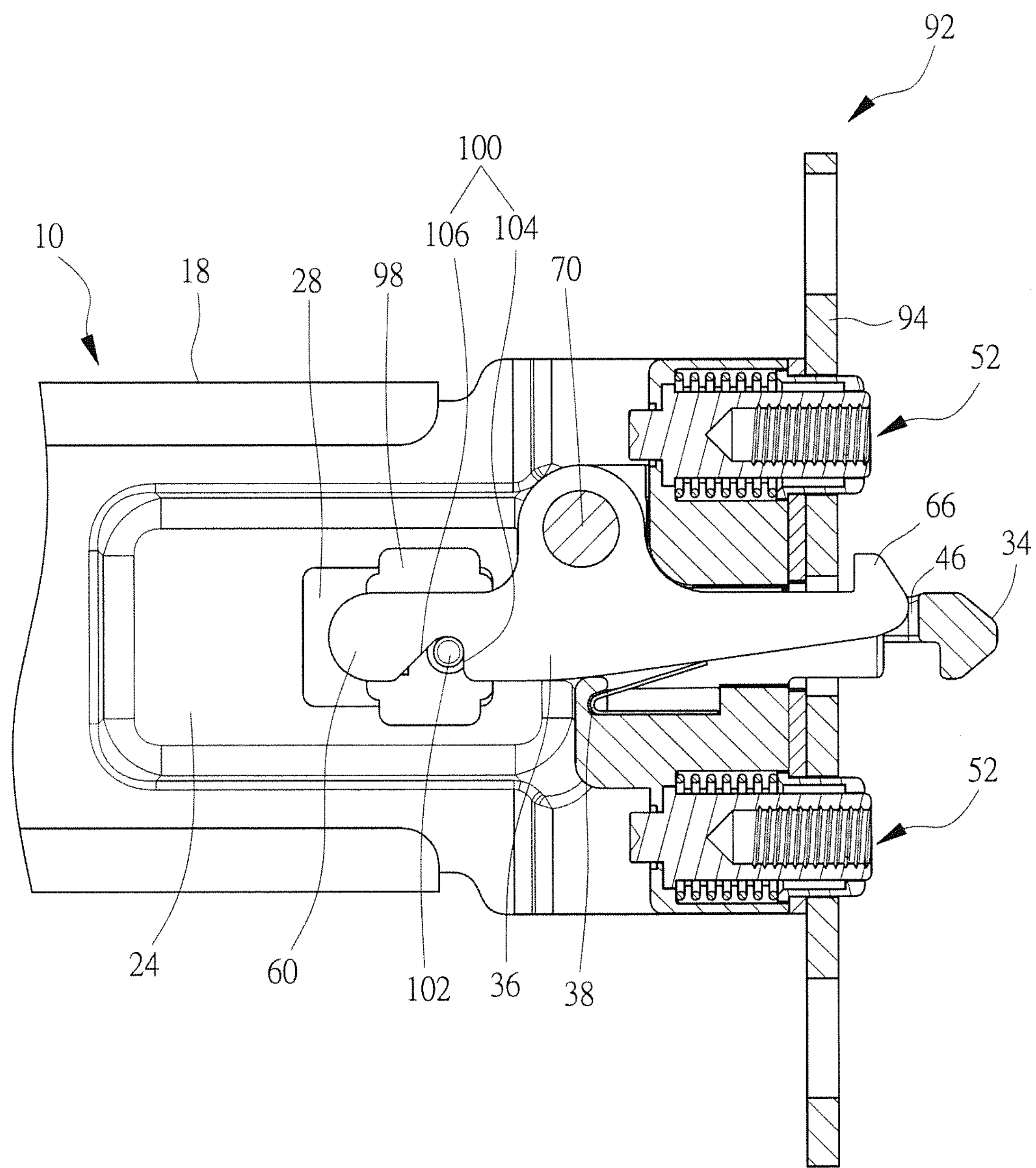
FIG. 8 is a cross sectional view to show the relationship between the slide and the engaging member.
Figure 9:
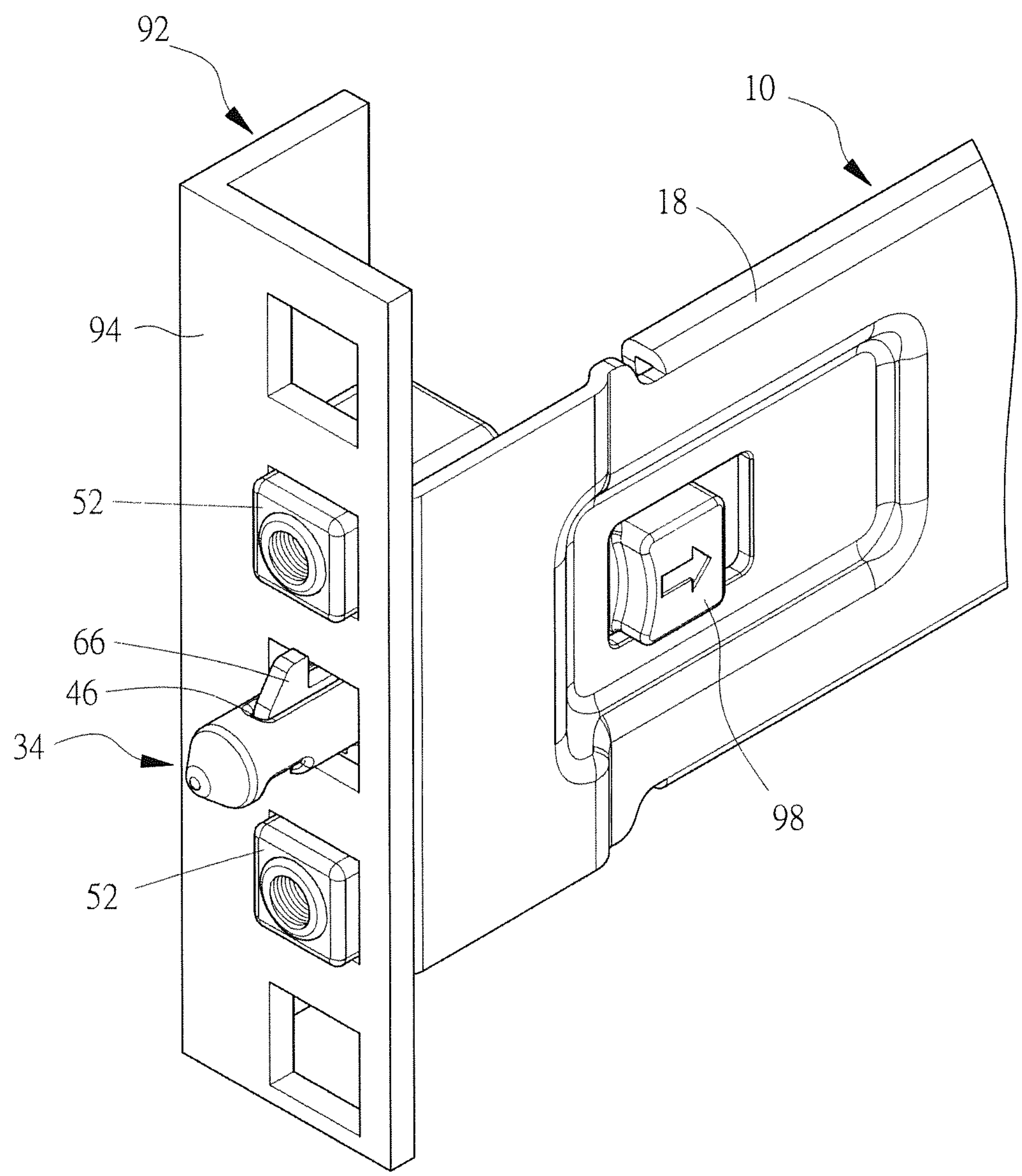
FIG. 9 is a perspective view to show the relationship between the slide and the engaging member.

FIGS. 8 and 9 show that a slide 98 is movably connected to the bracket 18 and is located corresponding to the engaging member 36. In one preferable embodiment, a slide 98 is movably connected to the bracket 18 and movably contacts the engaging member 36. Preferably, the slide 98 is located corresponding to the window 28 of the side wall 24 of the bracket 18 for convenience of operation to the users. Preferably, the engaging member 36 has a first linkage portion 100, and the slide 98 has a second linkage portion 102 which is located corresponding to the first linkage portion 100 and movably in contact with first linkage portion 100. More specifically, the first linkage portion 100 is a recess located the operation portion 60 of the engaging member 36 and has a contact portion 104 and a push portion 106 which is inclined relative to the contact portion 104. The second linkage portion 102 extends from the slide 98 and forms a protrusion which is movably in contact between the contact portion 104 and the push portion 106 of the first linkage portion 100. In one alternative equivalent example (not shown), the first and second linkage portions 100, 102 are a protrusion and a recess respectively.

Figure 10:
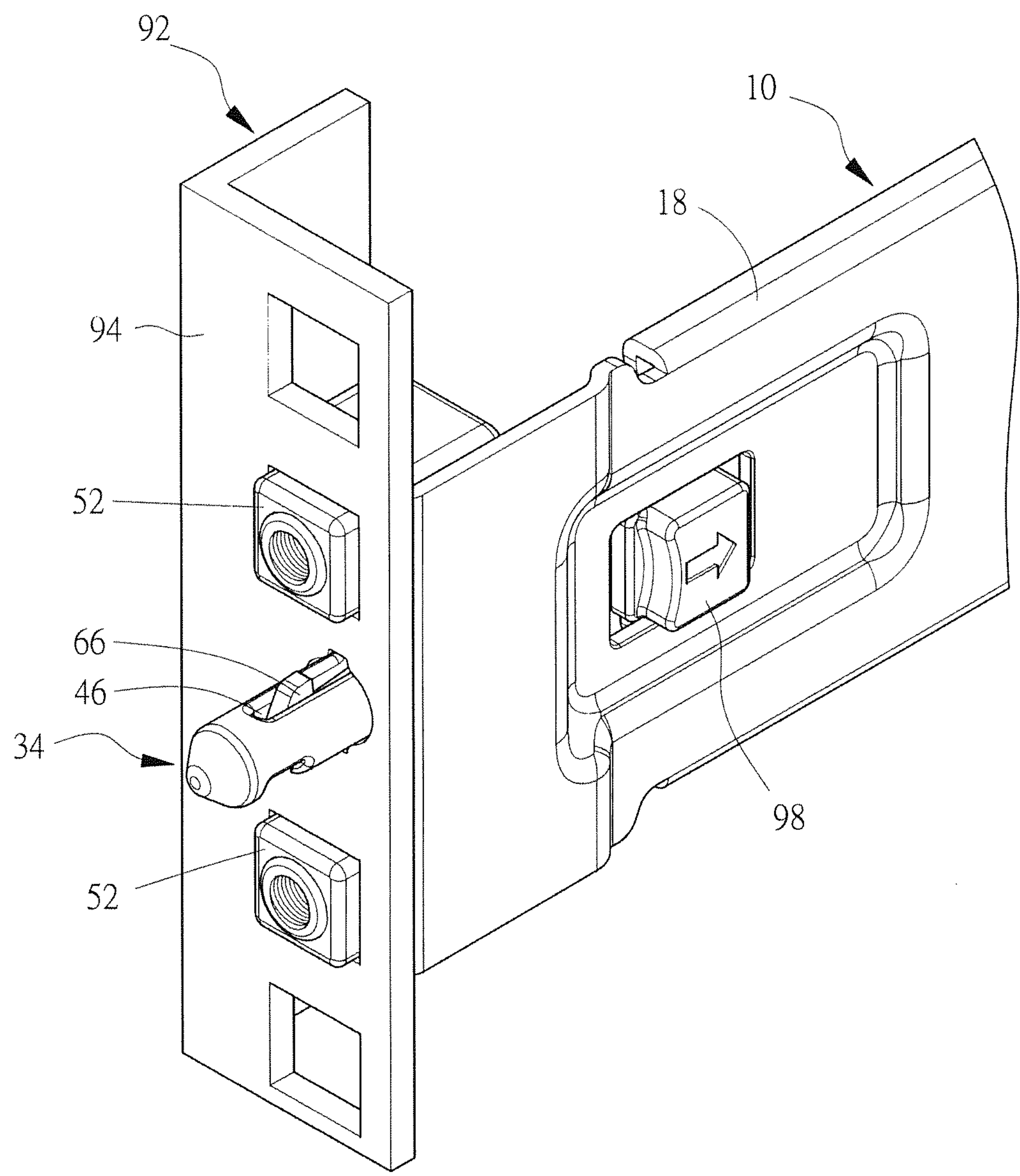
FIG. 10 shows that the bracket is separated from the column by the slide.
Figure 11:
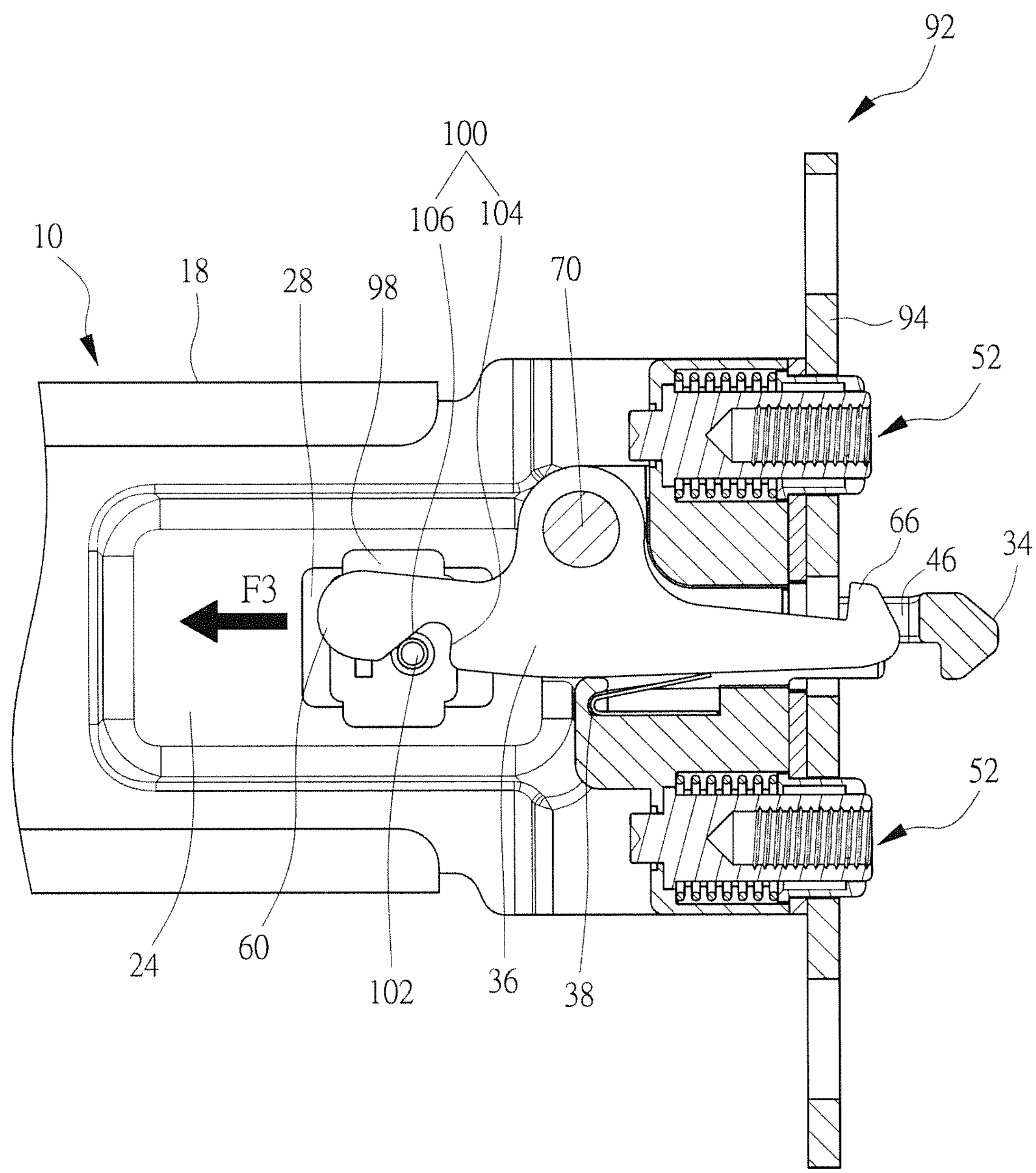
FIG. 11 is a cross sectional view to show that the bracket is to be separated from the column by the slide.

FIGS. 10 and 11 show that the slide assembly 10 with the slide 98 is moved away from the rack 92, wherein the user applies a force F3 from the window 28 of the bracket 18 to the slide 98 to move the slide 98 relative to the bracket 18. The second linkage portion 102 of the slide 98 contacts the push portion 106 of the first linkage portion 100 of the engaging member 36 so that the engaging member 36 is pivotable relative to the bracket 18. Therefore, the first protrusion 66 of the engaging member 36 is retracted toward the slot 46 to be disengaged from the column 94 of the rack 92. Preferably, as shown in FIG. 11, the direction that the slide 98 moves relative to the bracket 18 by the force F3 is identical to a direction that the slide assembly 10 is moved away from the column 94 of the rack 92, so that the user can easily disassemble the slide assembly 10 form the rack 92.

Figure 12:
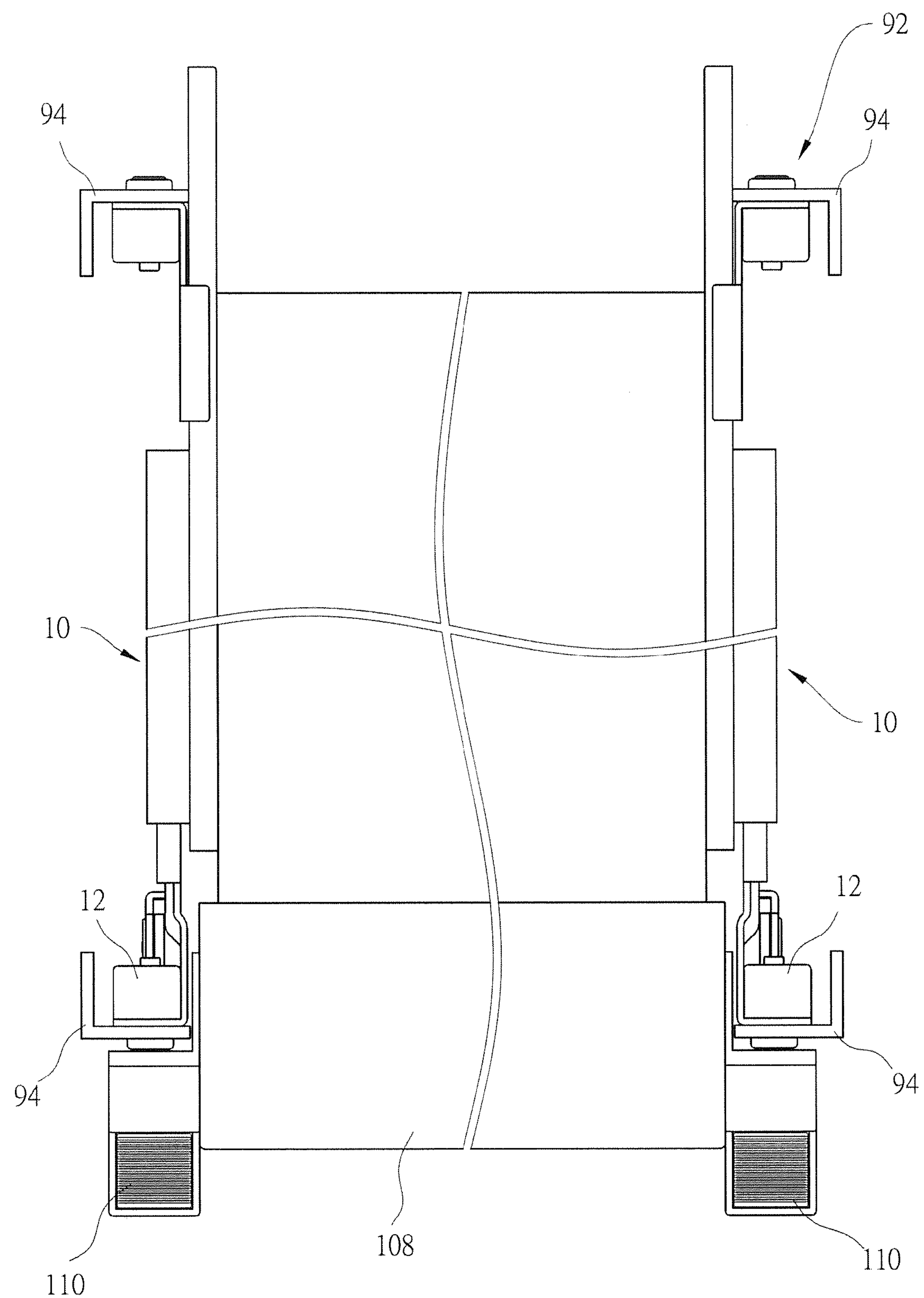
FIG. 12 shows that the chassis is installed to the rack.

FIG. 12 shows that the chassis 108 is installed to the rack 92 by two slide assemblies 10, wherein the rack 92 has four columns 94. In one preferable embodiment, the chassis 108 has at least one locking device 110 located corresponding to the fixing device 12.

Figure 13:
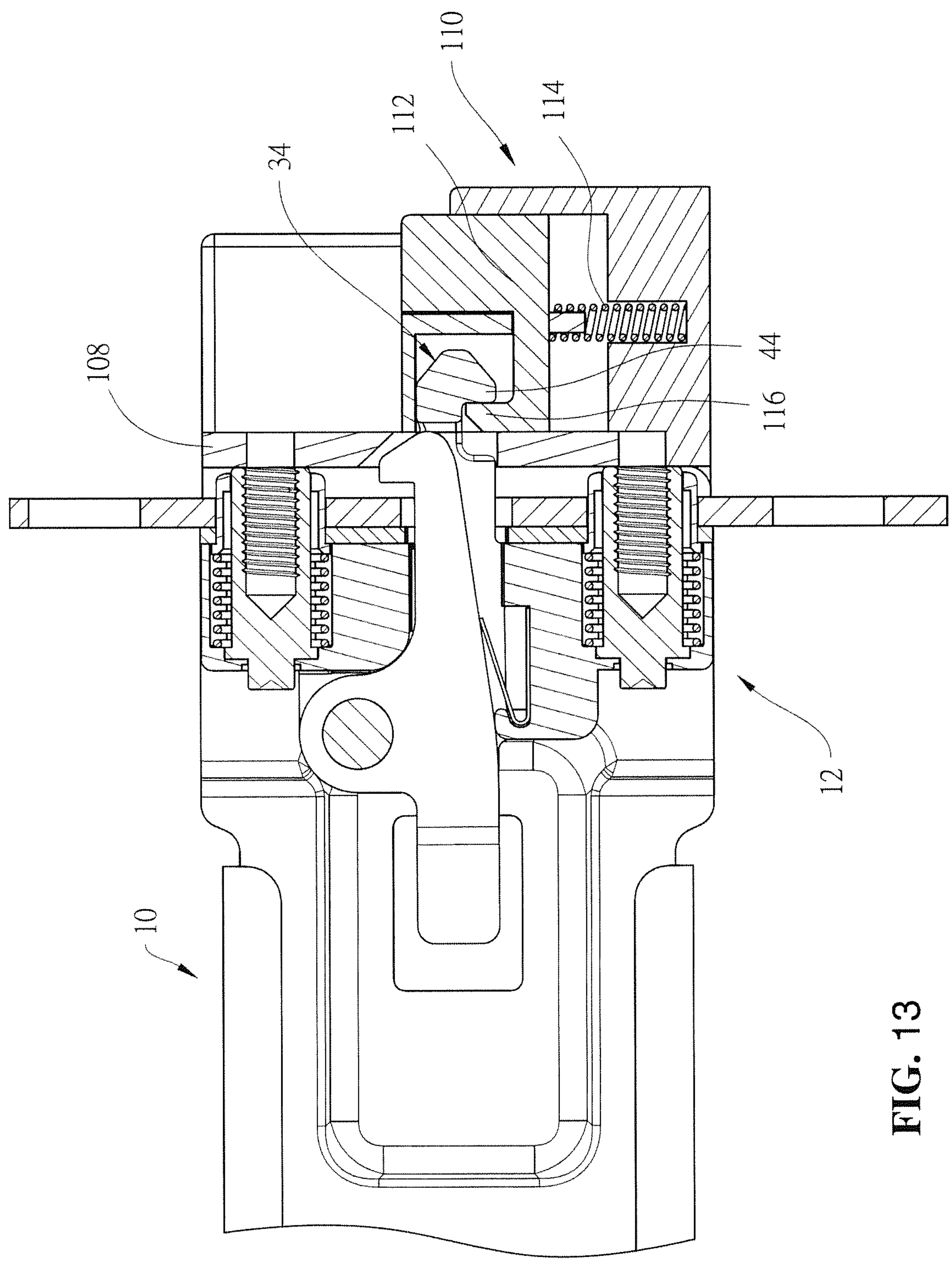
FIG. 13 shows the connection between the fixing device and the chassis.

FIG. 13 shows that the locking device 110 has a locking member 112 and a spring 114, wherein the locking member 112 has a second locking portion 116 located corresponding to the first locking portion 44 of the insertion member 34 of the fixing device 12. The first locking portion 44 of the insertion member 34 and the second locking portion 116 of the locking member 112 are engaged with each other by the spring 114 applying a force to the locking member 112. Therefore, the chassis 108 is firmly connected to the fixing device 12 of the slide assembly 10 by the locking device 110.

Figure 14:
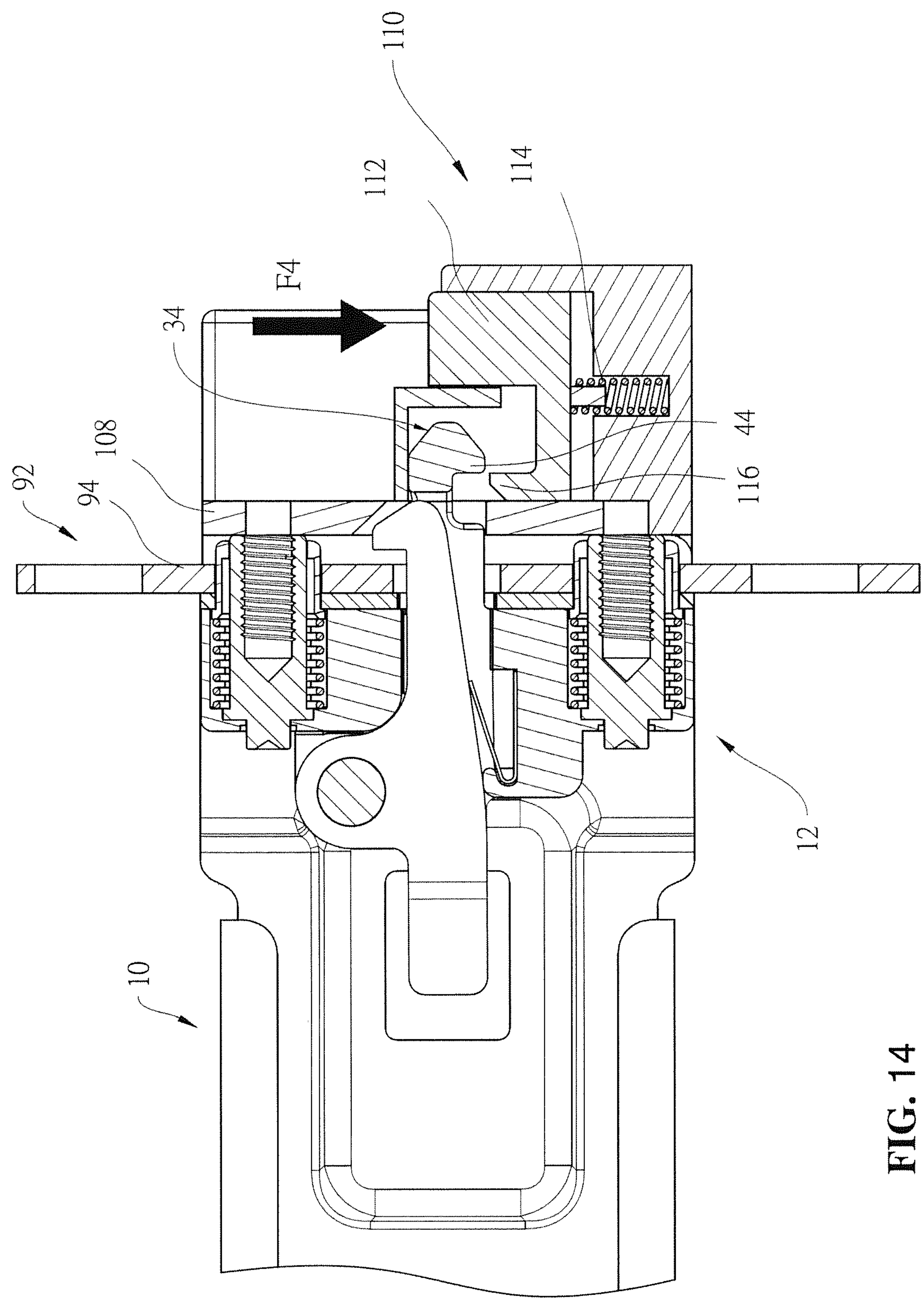
FIG. 14 shows the operation to separate the chassis from the fixing device.

FIG. 14 shows that when a force F4 is applied to the locking member 112 of the locking device 110, the locking member 112 moves and overcomes the spring force of the spring 114 in response to the force F4 to let the second locking portion 116 of the locking member 112 disengage from the first locking portion 44 of the insertion member 34. In this status, the chassis 108 can be easily moved away from the rack 92 by the two slide assemblies 10.

Figure 15:
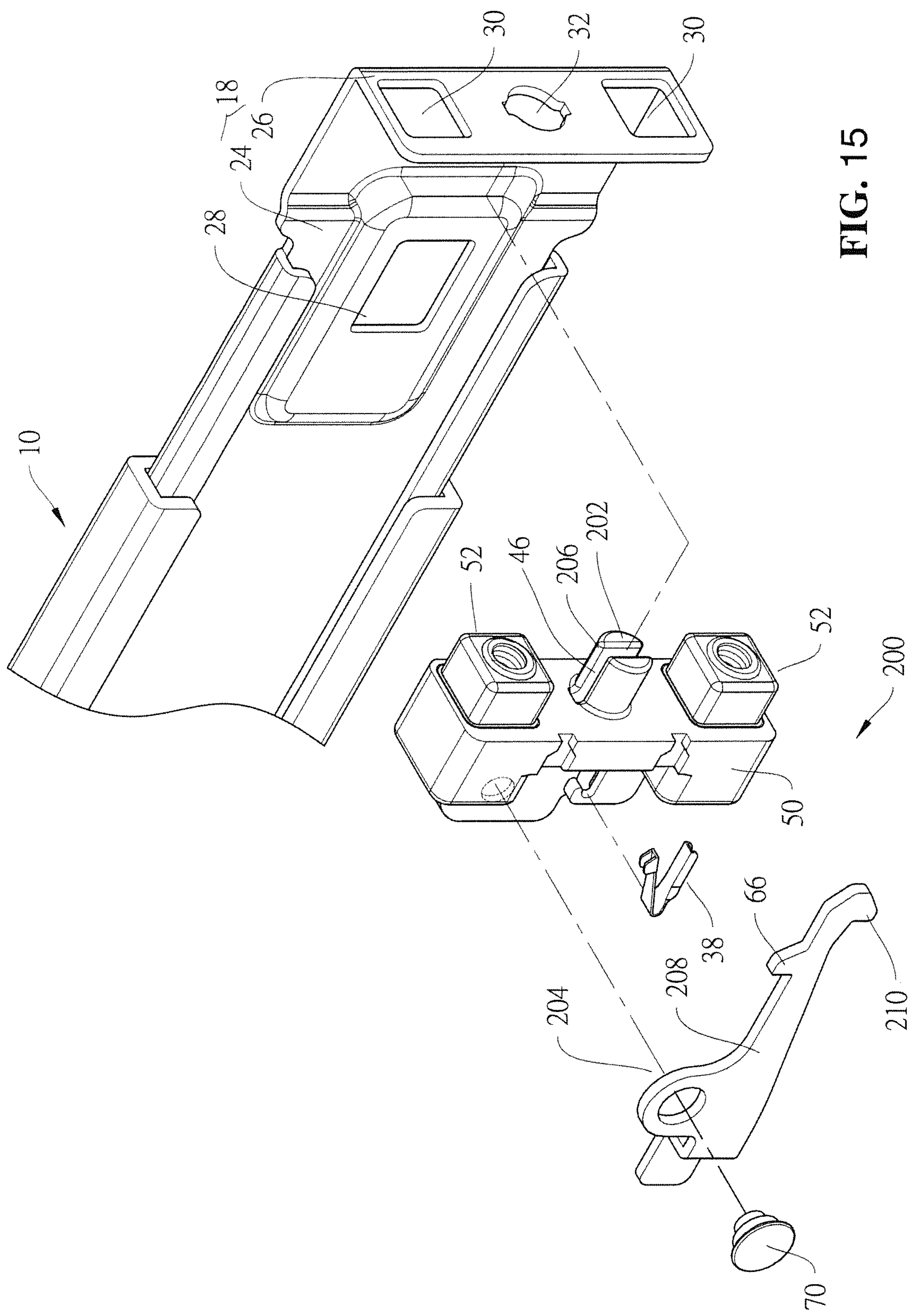
FIG. 15 is an exploded view to show the fixing device and the bracket of the other embodiment of the slide assembly.
Figure 16:
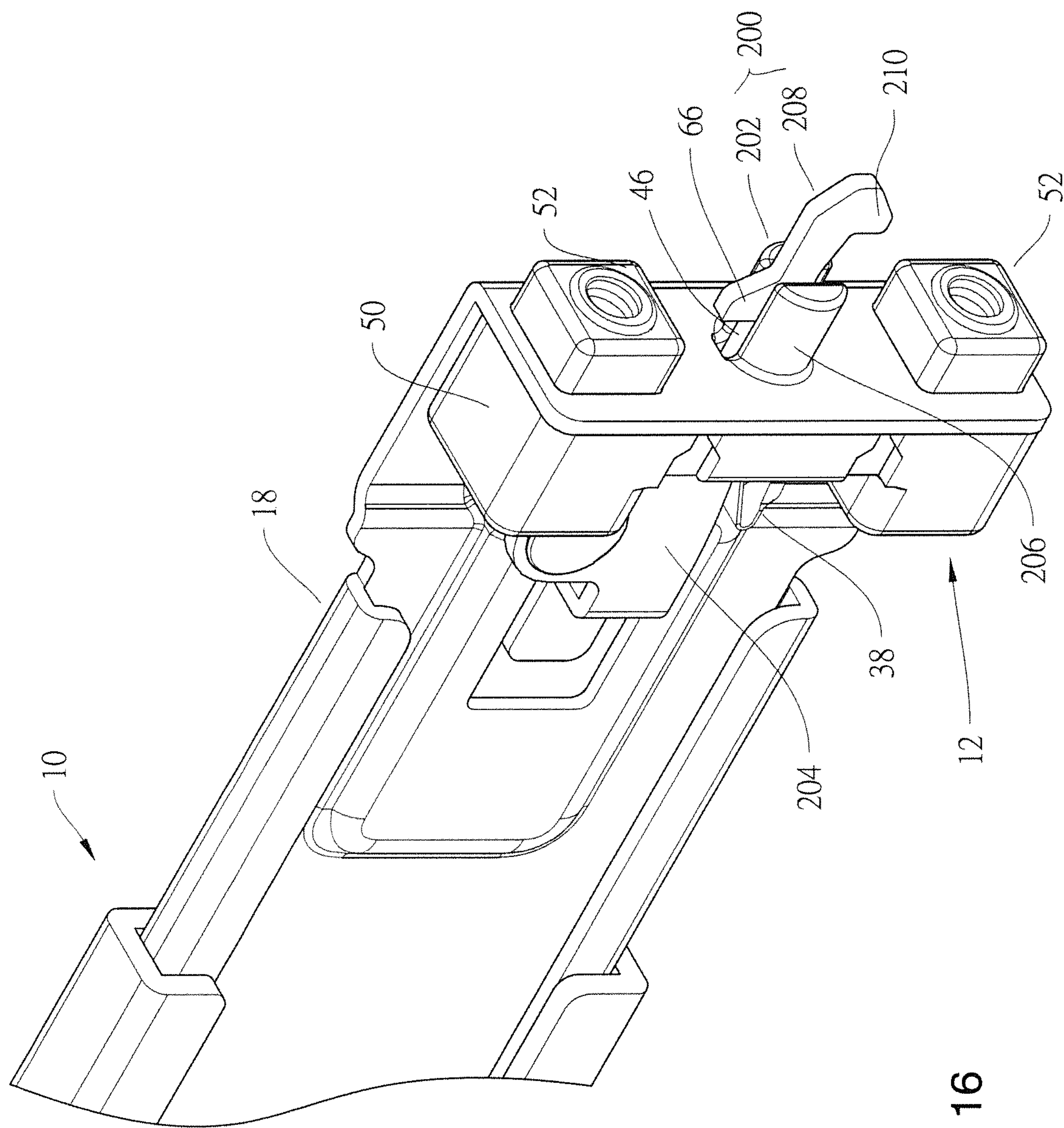
FIG. 16 shows that the fixing device is assembled to the bracket of the embodiment in FIG. 15.
Figure 17:
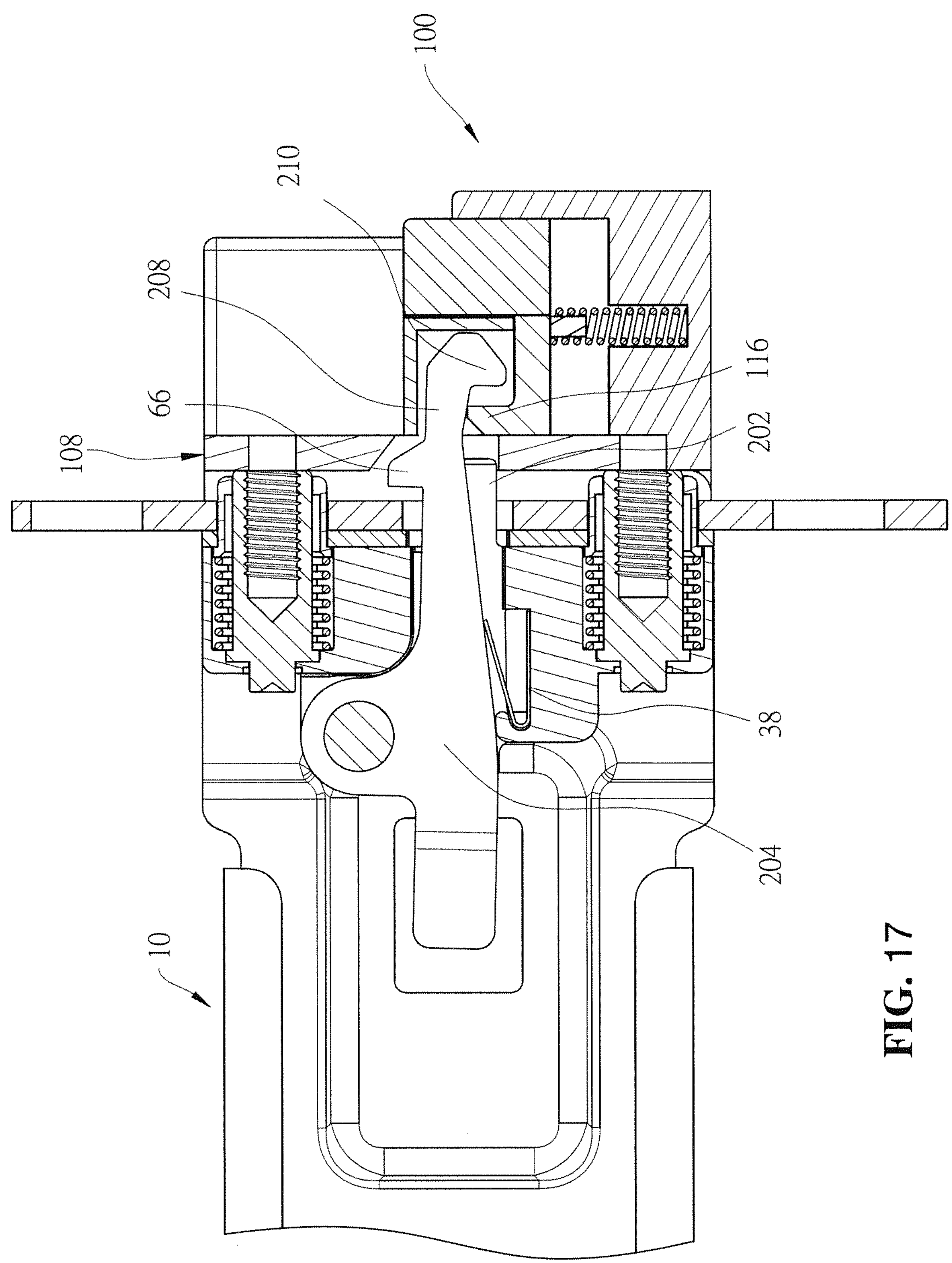
FIG. 17 shows the connection between the fixing device and the chassis of the embodiment in FIG. 15.

FIGS. 15 to 17 show another embodiment of the fixing device 200 which has an insertion member 202 and an engaging member 204, wherein the insertion member 202 is simply a body 206. The arm 208 of the engaging member 204 has a second protrusion 210 which is located corresponding to the second locking portion 116 of the locking device 110 of the chassis 108. When the chassis 108 is installed to the rack 92 by the two slide assemblies 10, the second locking portion 116 of the locking device 110 of the chassis 108 is engaged with the second protrusion 210 of the engaging member 204. Therefore, the embodiment omits the head 40 and the first locking portion 44.

It is noted that the fixing device 12/200 comprises the insertion member 34/202, the engaging member 36/204, and the resilient member 38. Preferably, the fixing device 12 or 200 further has at least one installation member 52. The locking device 110 is not restricted to be used in the chassis 108 only.

While we have shown and described the embodiment in accordance with the present invention, it should be clear to those skilled in the art that further embodiments may be made without departing from the scope of the present invention.

What is claimed is:

1. A slide assembly comprising:

a support member;

a bracket connected to the support member, the bracket having a side wall and an end wall, the side wall having a window, the end wall having a through hole formed therein and being substantially perpendicularly connected to the side wall;

at least one installation member connected to the end wall of the bracket;

an insertion member extending through the through hole in the end wall of the bracket and having a slot defined therein, the insertion member having a body and a head connected with the body, the body of the insertion member having a recessed area and a first locking portion which is located in the recessed area and adjacent to the head;

an engaging member pivotally connected relative to the bracket and having an operation portion and an arm, the operation portion located corresponding to the window of the side wall of the bracket, the arm extending through the slot of the insertion member and having a first protrusion; and a resilient member providing a force to the engaging member to extend the first protrusion beyond the slot of the insertion member.

2. The slide assembly as claimed in claim 1, wherein the end wall has two installation holes and a fixing member, the at least one installation member including two installation members which are connected to the fixing member, the fixing member is fixed to the bracket, and each of the installation members extend through a respective one of the installation holes of the end wall of the bracket.

3. The slide assembly as claimed in claim 2, wherein the resilient member is located between the fixing member and the engaging member, the resilient member has a first resilient section, a second resilient section and a connection section which is connected between the first and second resilient sections.

4. The slide assembly as claimed in claim 3, wherein the first and second resilient sections and the connection section of the resilient member define a resilient space, the first resilient section has two first side walls, the first side walls and the first resilient section define a first recess, the second resilient section has two second side walls, the second side walls and the second resilient section define a second recess, the fixing member has a first contact portion, the engaging member has a second contact portion, the first contact portion and the second contact portion contact the first and second recesses respectively.

5. A slide assembly comprising:

a support member;

a bracket connected to the support member, the bracket having a side wall and an end wall, the end wall having two installation holes and a fixing member, the side wall having a window, the end wall substantially perpendicularly connected to the side wall;

a pair of installation members connected to the fixing member, the fixing member is fixed to the bracket, and each of the installation members extend through a respective one of the installation holes of the end wall of the bracket, each installation member having a movable rectangular portion, a cylindrical portion and a spring, the rectangular portion being slidably connected to the cylindrical portion, the spring applying a force to the rectangular portion so that the rectangular portion extends beyond the fixing member and located at a preset position;

an insertion member connected to the end wall of the bracket and having a slot defined therein;

an engaging member pivotally connected relative to the bracket and having an operation portion and an arm, the operation portion located corresponding to the window of the side wall of the bracket, the arm extending through the slot of the insertion member and having a first protrusion; and a resilient member providing a force to the engaging member to extend the first protrusion beyond the slot of the insertion member.

6. A slide assembly for being installed to a rack which has multiple columns, each column having multiple holes which comprises a first hole, a second hole and a third hole located between the first and second holes, a chassis connected to the rack by two slide assemblies, the chassis has a locking device, each slide assembly comprising:

a first rail;

a second rail being slidable relative to the first rail;

a bracket connected to the first rail, the bracket having a side wall and an end wall, the side wall having a window, the end wall substantially perpendicularly connected to the side wall, the end wall having two installation holes and a through hole;

a fixing member fixed to the bracket;

a third rail slidably connected between the first and second rails;

an insertion member connected to the end wall of the bracket and partially extending through the through hole of the end wall of the bracket, the insertion member having a slot and a locking portion which is located corresponding to the locking device of the chassis;

an engaging member pivotally connected to one of the bracket and the fixing member, the engaging member having an operation portion and an arm, the operation portion located corresponding to the window of the side wall of the bracket, the arm extending through the slot of the insertion member and having a first protrusion;

a resilient member providing a force to the engaging member to extend the first protrusion beyond the slot of the insertion member;

two installation members connected to the fixing member, and extending through the installation holes of the end wall of the bracket respectively; and the two installation members installed through to the first and second holes of the column of the rack respectively, the insertion member inserted into the third hole of the column of the rack, the arm of the engaging member extending through the slot of the insertion member, the first protrusion of the engaging member extending beyond the slot of the insertion member and engaged with the column of the rack by the force of the resilient member applied to the engaging member, when the slide assembly is installed to the rack, the first locking portion of the insertion member is engaged with the locking device of the chassis.

7. The slide assembly as claimed in claim 6, further comprising a slide slidably connected to the bracket and movably contacting the engaging member, when the slide slides relative to the bracket, the slide drives the engaging member to pivot relative to the bracket so that the first protrusion of the engaging member is retracted toward the slot.

8. The slide assembly as claimed in claim 7, wherein a direction that the slide moves relative to the bracket is identical to a direction that the slide assembly is disassembled from the rack.

* * * * *